United States Patent [19]
Scepanovic et al.

[11] Patent Number: 6,000,038
[45] Date of Patent: Dec. 7, 1999

[54] PARALLEL PROCESSING OF INTEGRATED CIRCUIT PIN ARRIVAL TIMES

[75] Inventors: Ranko Scepanovic, San Jose, Calif.; Alexander E. Andreev, Moskovskaja Oblast, Russian Federation; Ivan Pavisic, Cupertino, Calif.

[73] Assignee: LSI Logic Corporation, Milpitas, Calif.

[21] Appl. No.: 08/964,784

[22] Filed: Nov. 5, 1997

[51] Int. Cl.⁶ ...................................................... G06F 17/50
[52] U.S. Cl. ................ 713/500; 395/500.07; 395/500.36
[58] Field of Search ......................... 395/500.07, 500.18, 395/500.12, 500.36; 714/33, 37; 713/500, 600

[56] References Cited

U.S. PATENT DOCUMENTS

| | | | |
|---|---|---|---|
| 4,890,238 | 12/1989 | Klein et al. | 364/491 |
| 5,673,198 | 9/1997 | Lawman et al. | 364/489 |
| 5,715,184 | 2/1998 | Tyler et al. | 364/578 |
| 5,751,593 | 5/1998 | Pullela et al. | 364/488 |
| 5,751,596 | 5/1998 | Ginetti et al. | 364/491 |
| 5,774,371 | 6/1998 | Kawakami | 364/491 |

*Primary Examiner*—Viet D. Vu
*Attorney, Agent, or Firm*—Mitchell Silberberg & Knupp LLP

[57] ABSTRACT

Integrated circuit chips (IC's) require proper placement of many cells (groups of circuit components) and complex routing of wires to connect the pins of the cells. Designing of the IC's require meeting real-world constraints such as minimization of the circuit area, minimization of wire length within the circuit, and minimization of the time the IC requires to perform its function, referred to as the IC delay. Because of the large number of cells and nets of an IC, the process of determining IC delay of an IC design requires a lot of time. The present invention discloses a method and apparatus for determining the IC delay quickly by using multiple processors and analyzing multiple pins simultaneously. Also disclosed is the method of ordering the pins to allow the application of the parallel processing technique.

11 Claims, 3 Drawing Sheets

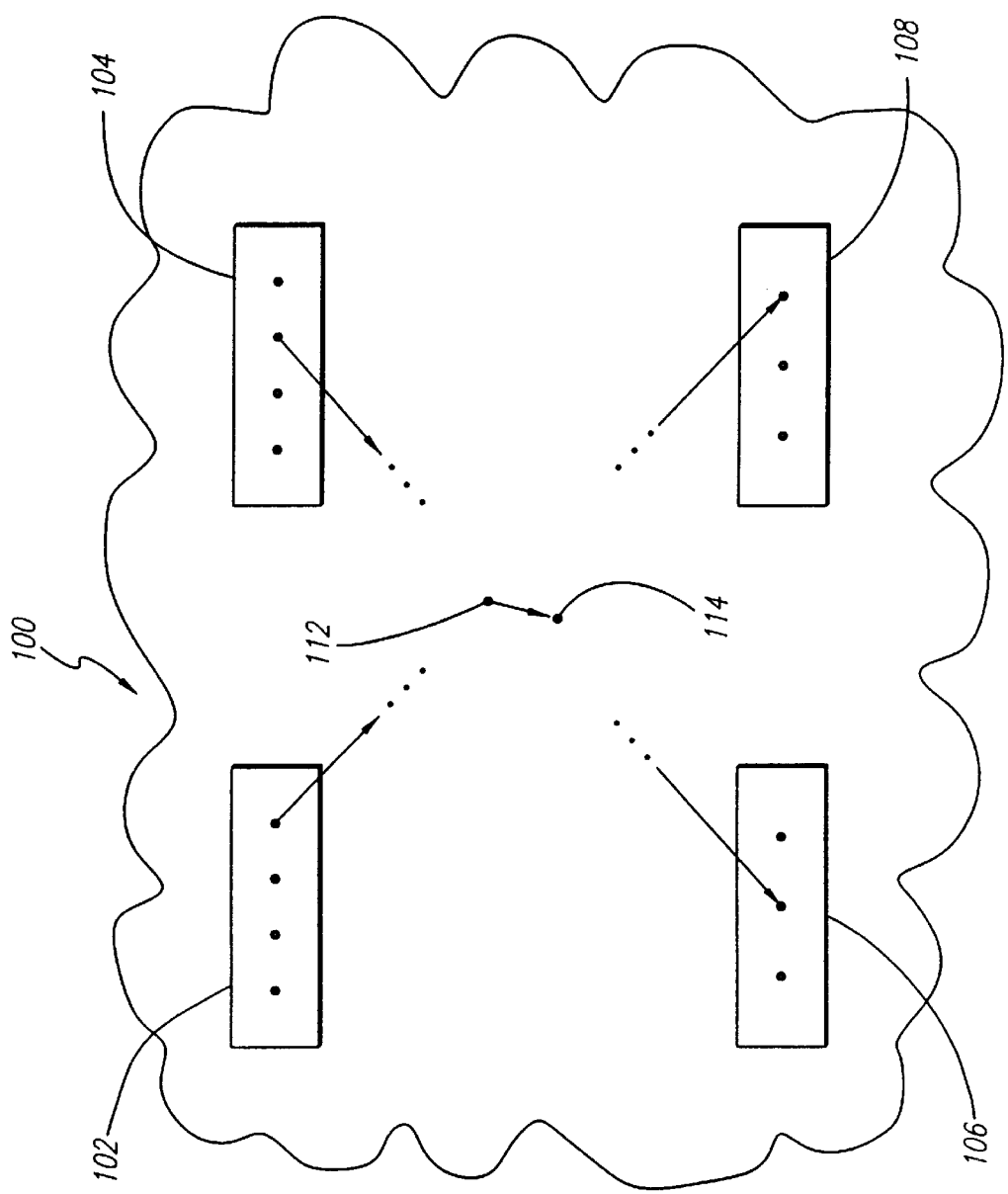

PARALLEL PROCESSING OF INTEGRATED CIRCUIT PIN ARRIVAL TIMES

BACKGROUND OF THE INVENTION

1. Field of the Invention

The present invention generally relates to the art of microelectronic integrated circuits. In particular, the present invention relates to the art of determining the performance of integrated circuits.

2. Description of Related Art

An integrated circuit chip (hereafter referred to as an "IC" or a "chip") comprises cells and connections between the cells formed on a surface of a semiconductor substrate. The IC may include a large number of cells and require complex connections between the cells.

A cell is a group of one or more circuit elements such as transistors, capacitors, and other basic circuit elements grouped to perform a function. Each of the cells of an IC may have one or more pins, each of which, in turn, may be connected to one or more other pins of the IC by wires. The wires connecting the pins of the IC are also formed on the surface of the chip. For example, FIG. 1A shows a grossly simplified IC 10 having four cells 12, 14, 16, and 18 and ten pins 22, 24, 26, 28, 30, 22, 34, 36, 38, and 40. For simplicity, the cells will be denoted $C_{nn}$ and the pins will be denoted $p_{nn}$ where nn is the reference number of the cell or the pin used in the figure.

A net is a set of two or more pins which must be connected. Because a typical chip has thousands, tens of thousands, or hundreds of thousands of pins, which must be connected in various combinations, the chip also includes definitions of thousands, tens of thousands, or hundreds of thousands of nets, or sets of pins. The number of the nets for a chip is typically in the same order as the order of the number of cells on that chip. Commonly, a majority of the nets include only two pins to be connected; however, many nets comprise three or more pins. Some nets may include hundreds of pins to be connected. The IC 10 of FIG. 1A has two nets. The first net is a two-pin net comprising pins $p_{34}$ and $p_{40}$. The second net is a three pin net comprising pins $p_{32}$, $p_{36}$, and $p_{38}$. A net can be denoted as a set of pins net $(p_1, p_2, \ldots p_n)$.

A netlist is a list of nets for a chip.

Typically, an IC has a plurality of input pins and a plurality of output pins. The inputs are digital electrical signals being provided to the IC to be operated on. The outputs are digital electrical signals resulting from the operations of the IC. In between the input pins receiving the input signals to the IC and the output pins providing the output signals, the digital signals are operated on by a plurality of cells connected to each other. The connections of the cells are defined by the nets discussed hereinabove. The IC 10 of FIG. 1A has three input pins—$p_{22}$, $p_{24}$, and $p_{26}$—and two output pins—$p_{28}$ and $p_{30}$. For the purposes of describing the present invention, the pins of the IC which are neither input pins nor output pins will be referred to as intermediate pins.

One of the major constraints in design and fabrication of IC's is the time the IC requires to perform the specified function. This is often referred to as the performance of the IC. To determine the performance of an IC, various time measurements must to be considered. This is because, in addition to the input and output lines, the IC may include internal registers, or flip-flops, which may store certain output values and provide a portion of input values to the logic circuits. The performance of an IC may be defined as the period of time between the instant the last of the input signals are available to the logic circuit (whether the signals are from the input lines or from internal registers) to the instant the latest of the output signals are available from the logic circuit (whether the signals are for the output lines or for internal registers). The instant the input signal is applied is often denoted as $t_0$. In any event, the performance of the IC is the period of time required for the logic circuits of the IC to perform their functions irrespective of whether the inputs to the logic circuits are from the input pins or from the flip-flops or the outputs from the logic circuits are to the output pins or to the flip-flops. The performance of the IC is also referred to as the delay of the IC, or the IC delay.

For example, if the inputs to the IC 10 of FIG. 1A is applied at time $t_0$ and the last of the output signals of the IC is available at $t_0+3$ ns (nano-seconds), then the delay of the IC 10 is 3 ns. This is true even if the other outputs signals of the IC are available at $t_0+1$ ns or at $t_0+2$ ns.

The performance of the IC depends on many factors such as the physical characteristics of the material, the layout of the cells, etc. Some of these factors, such as the physical characteristics of the material of the IC, cannot be changed during the cell placement and routing process. On the other hand, the placement of the cells and the routing of the nets can be modified during the placement process to improve the performance of the IC.

In order to increase the performance of the IC by modifying the placement of the cells and re-routing the nets, the paths of the IC must be analyzed and the critical paths identified. A path is a set of pins and edges through which information travels. A critical path is the path or the paths among all possible paths of an IC which causes the highest delay of the IC.

An edge is the direction of signals flow through the cells and the wires. There are two types of edges in an IC. A cell edge is the direction of signals flow through the cells of an IC, and is obtained by "connecting" an input pin of a cell with an output pin of the same cell. If a cell takes an input signal at pin $p_i$ and produces an output signal at pin $p_o$, then the cell edge for that signal flow is denoted $e_c(p_i, p_o)$. Then, $p_i$ is called a parent of $p_o$ and $p_o$ a child of $p_i$. For example, the IC 10 of FIG. 1A has several cell edges. The cell edges are $e_c(p_{22}, p_{32})$, $e_c(p_{24}, p_{34})$, $e_c(p_{26}, p_{34})$, $e_c(p_{36}, p_{38})$, $e_c(p_{38}, p_{30})$, and $e_c(p_{40}, p_{30})$. A pin may have none (for an input pin), one, or many parent(s), and none (for an output pin), one, or many children. An ancestor of p is any parent, grand-parent, or any pin within a path from an input pin to p, including the input pin but not including p.

A net edge is the direction of signal flow from an output pin of a cell to an input pin of another cell, and is obtained by connecting the driverpin of a net with a sink pin of the same net. A driverpin is the pin of a net which provides the signal to the sink pins of the same net and is typically an output pin of a cell. If a net has a driver pin $p_d$ which is connected to a sink pin $p_s$, then the net edge for that signal flow is denoted $e_n(p_d, p_s)$. A sink pin is a pin of a net which receives the signal from a driver pin, and is often an input pin of a cell. For example, the IC 10 of FIG. 1A has several net edges. The net edges are $e_n(p_{32}, p_{36})$, $e_n(p_{32}, p_{38})$, and $e_n(p_{34}, p_{40})$.

All edges of an IC are directed edges having a driver pin from which the signal originates and a sink pin to which the signal flows. For the purposes of the present invention, the distinction between the cell edges and net edges is not critical. Therefore, an edge will mean a cell edge or a net edge, and will be denoted $e(p_p, p_c)$ to indicate an edge between a parent pin $p_p$ and a child pin $p_c$.

A path may be denoted as a set of pins and edges, for example, path($p_1$, $e(p_1, p_2)$, $p_2$, $e(p_2, p_3)$, $p_3$, . . . ). An alterative expression of the path is to merely list the nodes, for example, path($p_1$, $p_2$, . . . ). Regardless of how it is denoted, a path comprises pins and edges.

FIG. 1B illustrates a directed graph constructed from the pins and the edges of the IC 10 of FIG. 1A. Each node of the graph 50 corresponds to a pin of the IC 10 of FIG. 1, and each edge of the graph 50 corresponds to an edge of the same IC 10. In FIG. 1B, the edges are directed. That is, each of the edges is indicated by an arrow to show the direction of the signal flow. In the present specification, the terms pins and the nodes will be used interchangeably unless otherwise specified. The nodes of a directed timing graph represent the pins of the IC.

Because each of the edges of the directed graph 50 of FIG. 1B represents a signal traveling through a cell or through a wire, each of the edges can be assigned an edge delay to indicate the time required for a signal to travel from the parent pin to the child pin. Then, the directed graph is referred to as a directed timing graph or merely a timing graph. The delay of $e(p_1, p_2)$ is denoted delay($p_1, p_2$). It takes time for each electrical signal to travel from pin to pin; thus, every edge has a delay.

The paths of the timing graph of an IC can be analyzed to locate the critical paths.

The timing characteristics of the cell edges can be obtained from libraries. However, the timing characteristics of net edges are not easily obtainable before the actual routing of the nets.

The period of time required for signals to travel from an input pin to pin p may be called the arrival time of pin p. For the purposes of analysis of an IC, all of the input signals of the IC are assumed to be available at the same time. The arrival time of node p, denoted arrival(p), is the latest time a signal from an input node reaches the node through any available path from the input node to the node. Formally, arrival(p) is $$arrival(p) = \max_{i=1-k}(arrival(p_i) + delay(p_i, p))$$

where k is the number of parents of p; and p is a child of $p_i$;

$p_i$ is a parent of p; and arrival(p)=0 if p is an input node.

To determine the performance, or the delay, of an IC, each of the paths of the IC must be analyzed. The IC delay may be expressed as the largest arrival time of any of the output nodes, or $$IC\ delay = \max_{j=1-m}(arrival(p_j))$$

where m is the number of output pins of the IC;

$p_j$ is an output pin.

As discussed above, the IC delay is the period of time signals take to travel from an input pin to an output pin. Accordingly, it is not possible to determine the IC delay at an output pin without first determining the delay from the input pins to each of the intermediate pins the signal travels through to arrive at the output pin. In fact, for any pin not an input pin, arrival(p) cannot be determined unless the arrival (p) of all of its ancestors are first found.

For example, referring to FIG. 2, the IC delay of the chip represented by the timing graph 70 cannot be determined unless arrival($p_{90}$) and arrival($p_{92}$) are found. However, arrival($p_{92}$) cannot be found until arrival($p_{86}$) is first determined. Likewise, arrival($p_{86}$) cannot be found until arrival ($p_{82}$) and arrival($_{80}$) are found, and so on.

In short, to find the delay of an IC, the arrival time of each of the pins of the IC must be determined. Because a typical IC contains many thousands or even millions of pins and paths, the analysis of arrival times for each of the pins is computationally expensive. Accordingly, the IC delay analysis of large IC circuits requires a large amount of time even when utilizing very powerful computers.

SUMMARY OF THE INVENTION

Therefore, an object of the present invention is to decrease the amount of time required to determine the IC delay of an IC.

To achieve the object of the invention, the present invention provides for a method and apparatus to determine the IC delay of a circuit by substantially simultaneously determining arrival time of a first pin and arrival time of a second pin.

The present invention provides for another method to determine the IC delay of an IC. The IC delay is determined by constructing a timing graph representing the circuit, determining arrival time at a first node of a first level, and simultaneously determining arrival time at a second node of said first level.

The present invention also provides for an apparatus for determining the delay of a circuit. The apparatus comprises a plurality of processors operating substantially simultaneously to determine arrival times for the pins of the circuit. The apparatus also comprises memory containing the instructions for the processors to simultaneously determine the arrival time of the pins of the IC.

The memory may be a machine-readable storage medium containing instructions for a plurality of processors to simultaneously determine the arrival time of the pins of the IC.

These and other aspects, features, and advantages of the present invention will be apparent to those persons having ordinary skilled in the art to which the present invention relates from the foregoing description and the accompanying drawings.

BRIEF DESCRIPTION OF THE DRAWINGS

FIG. 3 is another sample timing graph used to illustrate intervals;

DETAILED DESCRIPTION OF THE PREFERRED EMBODIMENT(S)

Timing Graph Construction

Figure 2:
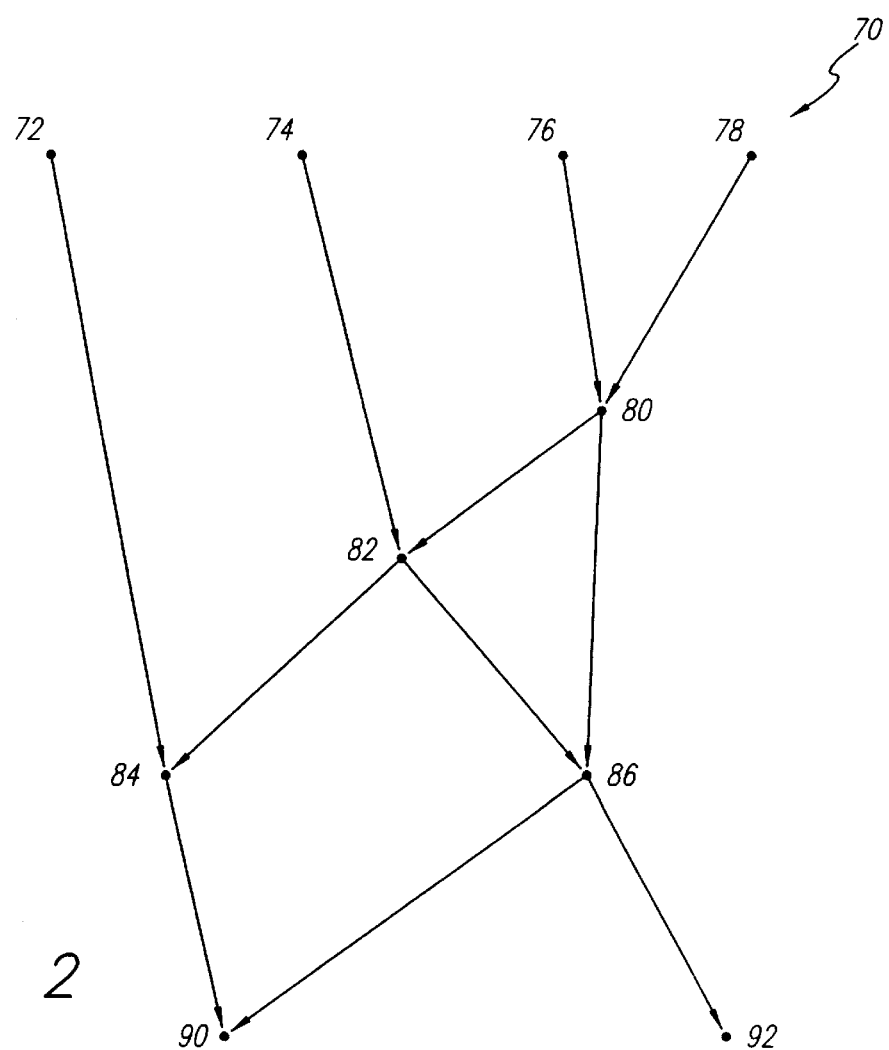
FIG. 2 is a sample directed timing graph.

Directed timing graphs may be used to facilitate the analysis of the paths of an IC. Referring again to FIG. 2, a timing graph 70 is illustrated. The timing graph 70 has input pins 72, 74, 76, and 78, output pins 90 and 92, and pins 80, 82, 84, and 86. For simplicity, the pins will be denoted $p_{nn}$ where nn is the reference number of the pin used in the figure. The graph 70 also has the following edges $e(p_{72}, p_{84})$, $e(p_{74}, p_{82})$, $e(p_{76}, p_{80})$, $e(p_{78}, p_{80})$, $e(p_{80}, p_{82})$, $e(p_{80}, p_{86})$, $e(p_{82}, p_{84})$, $e(p_{82}, p_{86})$, $e(p_{84}, p_{90})$, $e(p_{86}, p_{90})$, and $e(p_{86}, p_{92})$. In the present specification, the terms pins and the nodes will be used interchangeably unless otherwise specified.

Regular Enumeration

Each of the pins of an IC is assigned a Regular Enumeration Number (ren) such that, for each pin, the ren of any of its parents is smaller than the ren of any of are children. For a graph having $N_p$ pins, the numbers 0 to $N_p-1$ is assigned to its pins. A ren of a pin p will be denoted as ren(p).

Initially, each node of the graph is assigned a number which is the number of its parents which do not have an assigned ren. This value may be denoted as the no_of_parents_without_ren(p). The "Initial" row of Table 1 below shows the initial no_of_parents_without_ren(p) values for all the pins of the sample graph 70 of FIG. 2. In the beginning, no ren(p) values have been assigned, so no_of_parents_without_ren(p) for any p is the number of parents of that p. Thus, initially, only the input nodes have the no_of_parents_without_ren(p) value of zero (0) because they have no parents.

TABLE 1

| Iteration | Enumerated Nodes | no_of_parents_withou_ren(p) | | | | | | | | | |
|---|---|---|---|---|---|---|---|---|---|---|---|
| | | $p_{72}$ | $p_{74}$ | $p_{76}$ | $p_{78}$ | $p_{80}$ | $p_{82}$ | $p_{84}$ | $p_{86}$ | $p_{90}$ | $p_{92}$ |
| Initial | | 0 | 0 | 0 | 0 | 2 | 3 | 2 | 2 | 2 | 1 |
| 1 | $p_{72}, p_{74}, p_{76}, p_{78}$ | — | — | — | — | 0 | 1 | 1 | 2 | 2 | 1 |
| 2 | $p_{80}$ | — | — | — | — | — | 0 | 1 | 1 | 2 | 1 |
| 3 | $p_{82}$ | — | — | — | — | — | — | 0 | 0 | 2 | 1 |
| 4 | $p_{84}, p_{86}$ | — | — | — | — | — | — | — | — | 0 | 0 |
| 5 | $p_{90}, p_{92}$ | — | — | — | — | — | — | — | — | — | — |

After the initial assignment of the no_of_parents_without_ren(p) values to the pins, the first iteration begins by assigning the next available enumeration number for all the pins having the no_of_parents_without_ren(p) value of zero. In the present example, pins $p_{72}, p_{74}, p_{76},$ and $p_{78}$ are assigned ren 0, 1, 2, and 3, respectively. This is indicated by the "1" row of the "Iteration" column of Table 2 below. Then, the nodes with ren values are removed from further consideration and the nodes of the graph which are affected by the ren value assignments are re-analyzed for the new no_of_parents_without_ren(p) values. These are typically the children nodes. In the present example, these are $p_{80}, p_{82},$ and $p_{84}$. As an example, pin $p_{80}$ had an initial no_of_parents_without_ren(p) value of two (2) because both of its parents, $p_{76}$ and $p_{78}$, lacked ren values. After ren values have been assigned to the parents of $p_{80}$, the no_of_parents_without_ren(p) becomes zero (0) because the both of its parents have ren numbers.

The steps of the above paragraph are repeated until ren values have been assigned to all of the nodes of the graph.

Table 2 below shows the resultant ren(p) values for each of the pins following the iterations discussed above.

TABLE 2

| Iteration | Enumerated Nodes | Regular Enumeration Number of the nodes, ren(p) | | | | | | | | | |
|---|---|---|---|---|---|---|---|---|---|---|---|
| | | $p_{72}$ | $p_{74}$ | $p_{76}$ | $p_{78}$ | $p_{80}$ | $p_{82}$ | $p_{84}$ | $p_{86}$ | $p_{90}$ | $p_{92}$ |
| Initial | | — | — | — | — | — | — | — | — | — | — |
| 1 | $p_{72}, p_{74}, p_{76}, p_{78}$ | 0 | 1 | 2 | 3 | — | — | — | — | — | — |
| 2 | $p_{80}$ | 0 | 1 | 2 | 3 | 4 | — | — | — | — | — |
| 3 | $p_{82}$ | 0 | 1 | 2 | 3 | 4 | 5 | — | — | — | — |
| 4 | $p_{84}, p_{86}$ | 0 | 1 | 2 | 3 | 4 | 5 | 6 | 7 | — | — |
| 5 | $p_{90}, p_{92}$ | 0 | 1 | 2 | 3 | 4 | 5 | 6 | 7 | 8 | 9 |

Using the regular enumeration technique, the depth of a node can be easily identified for each of the nodes. The depth of a node, denoted depth(p), is the maximum length of all possible paths from any of the inputs of the IC to the pin p. The length of a path is the number of edges in the path.

Here, the depth of a node is one less than the iteration number at which the node is assigned a ren value. For instance, the $ren(p_{84})$ and $ren(p_{86})$ are assigned to the pins $p_{84}$ and $p_{86}$ during the $4^{th}$ iteration of the regular enumeration process. Thus, the depth of pins $p_{84}$ and $p_{86}$ are 3(=4−1).

An alternative method of determining the depth of a node is to traverse the nodes in the regular enumerated order and assign the depth(p) as zero (0) if p is an input node and the depth(p) as one more than the maximum depth of p's parents if p is not an input node. Formally, depth(p) is:

depth(p)=0 if p is an input node;

$$\text{depth}(p) = 1 + \max_{i=1-k}(\text{depth}(p_i))$$

where k is the number of parents and p is not an input node.

All nodes belonging to the same depth form a level. All pins of the same level are contemporary of each other.

In the regular enumeration process, the order in which the ren values are assigned to the nodes of the same level is not important. However, the regular enumeration process assures that a $ren(p_i)$ of any $p_i$ of a level is smaller than the $ren(p_j)$ of any $p_j$ if $p_i$ belongs to a higher level than $p_j$. A level $l_1$ is higher than level $l_2$ if $l_1$ is closer to the input pins than $l_2$. Then, the ren(p) for p belonging to $l_1$ is smaller than ren(p) where p belongs to $l_2$.

Parallel Processing

The key for parallelization is the fact that the determination of arrival time of a node p at level k requires the arrival times of all the ancestors of p, which are on the levels higher than k. A level, level k, is higher than another level, level l, if level k is closer to the input pins than level l, with the input pins being at the top level, level 0. However, to determine the arrival time of a node p at level k does not require the determination of the arrival times of any of p's contemporaries. Thus, the arrival time of the pins of a level can be calculated simultaneously using multiple processors.

After the enumeration process, pins can be assigned to multiple processors for simultaneous determination of arrival times for the nodes. The arrival time calculations are performed level by level because, in general, the arrival time of a pin belonging to a level cannot be determined until the arrival time of the pins of the parent level.

The arrival time calculation is performed level by level, starting from level 0, the input pin level. Each of the multiple processor are assigned a node to analyze. When a processor completes its analysis of the assigned node, another node from the same level is assigned to the processor to be analyzed. This step is repeated until all the nodes of a level is analyzed before the nodes of the next level is analyzed.

Typically, an IC has thousands or millions of pins, and a level of a timing graph may have up to hundreds or even thousands of pins. Therefore, an alternative technique is to group the nodes of a level, each group having a predetermined number of nodes, and assign a group to each of the processors. Each processor is assigned to a group of nodes. After a processor completes analyzing the nodes of its assigned group, the processor is assigned the next group of nodes of the same level. This is repeated until no groups of nodes are left for the level, and, eventually, for the entire IC. Experiments have shown that a workable beginning size of the group is sixteen (16) nodes.

Yet another technique is to divide all nodes of a level into as many groups as there are processors, and assign a group of nodes to each of the multiple processors. This alterative approach is appropriate when good estimates exist for the run time needed to analyze each of the nodes of the level. Then, the run time estimate are used to balance the workload between the multiple processors when grouping the nodes.

Handling Multiple Intervals

An interval is a set of nodes and edges (a graph or a sub-graph) representing all paths connecting given set of input nodes, denoted S, with a given set of output nodes, denoted E. An interval is denoted I(S, E) where S (for Start) is the set of input nodes and E (for End) is the set of output nodes. The concept of intervals is used to analyze different sets of paths independently from each other. This technique is especially important for IC's having multiple intervals utilizing the same or interconnected circuits (leading to the same or interconnected timing graph analysis). In addition, different intervals often use different clocks to synchronize the circuits. The intervals will be referred to as In where n is the index used to distinguish the intervals.

FIG. 3 illustrates a graph 100 comprising two sets of input nodes, 102 and 104 and two sets of outputs nodes 106 and 108. The sets of input nodes will be referred to as $S_{102}$ and $S_{104}$ and the sets of output nodes will be referred to as $E_{106}$ and $E_{108}$. Then, for the graph 100, there are four possible intervals—$I_1(S_{102}, E_{106})$, $I_2(S_{102}, E_{108})$, $I_3(S_{104}, E_{106})$, and $I_4(S_{104}, E_{108})$. Graph 100 further comprises pins 112 and 114, denoted $P_{112}$ and $P_{114}$, and an edge $e(p_{112}, p_{114})$.

For the purposes of the present invention, each of the pins of a timing graph is analyzed for each of the intervals the pin belongs to. That is, each of the pin, p, will have an independent arrival(p) value for each of the intervals the pin p belongs to. These values are typically denoted arrival(p, $I_i$) where $I_i$ is the interval. The IC delay, D, of an interval I can be denoted D(I). Moreover, to determine the arrival time of the pins of the IC, each interval should be analyzed independently from each other because each of the pins may belong to different levels of the intervals.

Parallel Delay Calculation Apparatus

Figure 1A:
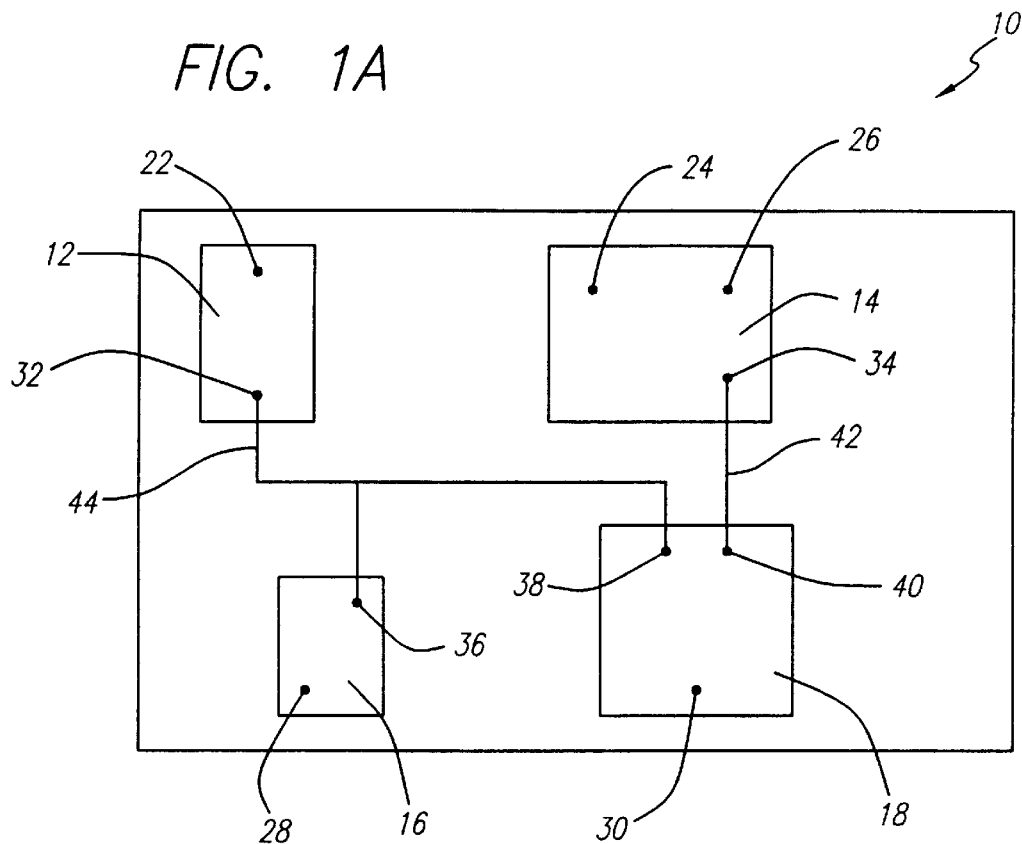
FIG. 1A is a simplified illustration of an integrated circuit chip.
Figure 4:
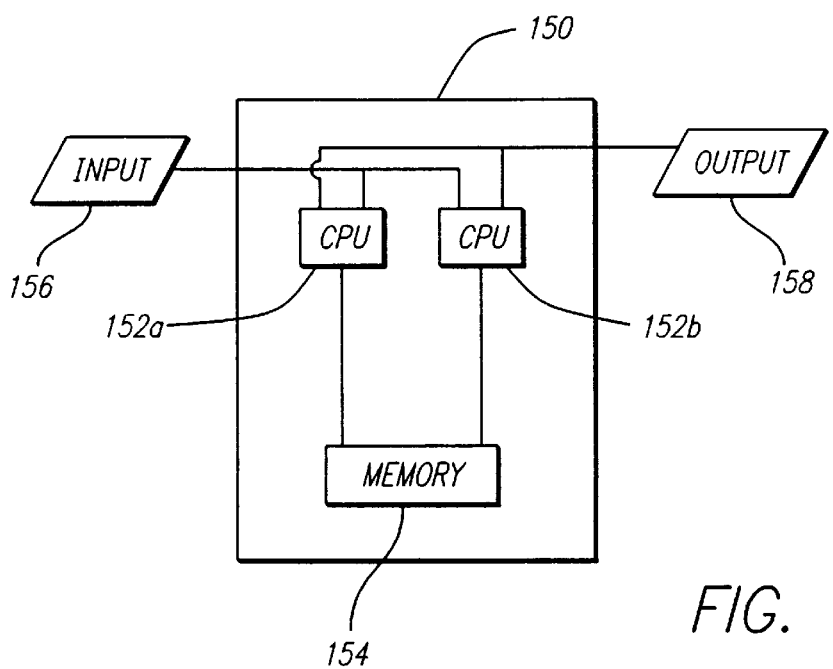
FIG. 4 is a block diagram illustrating an apparatus according to a preferred embodiment of the present invention.
Figure 1B:
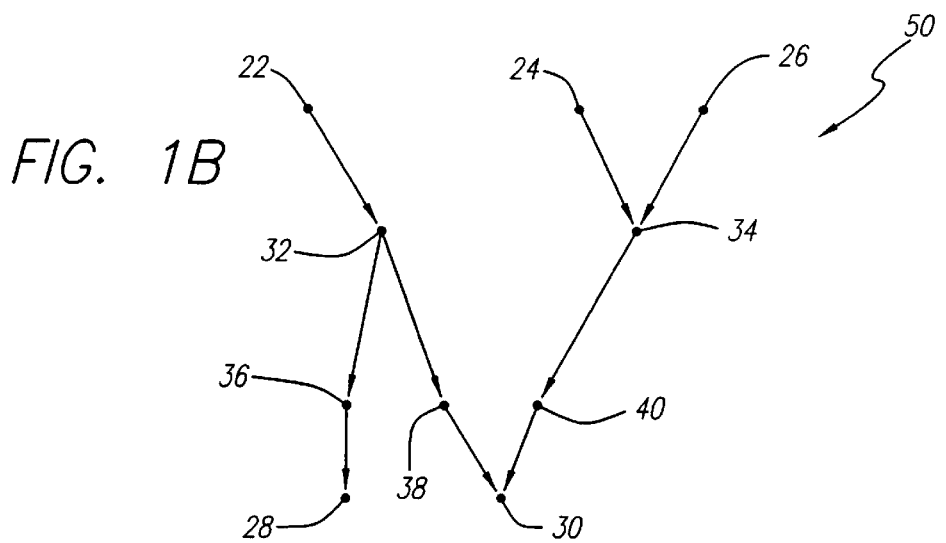
FIG. 1B is a timing graph derived from the integrated circuit chip of FIG. 1A.

Now referring to FIG. 4, a computing apparatus 150 for dynamically identifying and optimizing a critical path is illustrated. The apparatus comprises two processors, 152a and 152b, and memory 154 connected to the processors 152a, 152b. The memory 154 stores instructions for the processors, 152a, 152b, to read input information 156, determine arrival time of a first node of a first level; and simultaneously determine arrival time of a second node of said first level. After performing their functions, the processors, 152a, 152b, produce, as output 158, path and timing information regarding the circuit described by the input information 156.

The memory 154 may be any kind of machine-readable storage medium containing the instructions for the processor to read input information 156, and determine arrival time and IC delay of the circuit described by the input information 156. It is well known in the art that the memory may be formed as a semiconductor memory device, magnetic device, optical device, magneto-optical device, floppy diskette, hard drive, CD-ROM, magnetic tape, computer memory, or memory card.

The apparatus 150, as shown, comprises only two processors. To improve performance, the parallel processing of the nodes of the timing graph may be accomplished by an apparatus comprising many processors, operating simultaneously, to determine the arrival times of the nodes of the graph.

Although the present invention has been described in detail with regarding the exemplary embodiments and drawings thereof, it should be apparent to those skilled in the art that various adaptations and modifications of the present invention may be accomplished without departing from the spirit and the scope of the invention. Accordingly, the invention is not limited to the precise embodiment shown in the drawings and described in detail hereinabove. Therefore, it is intended that all such variations not departing from the spirit of the invention be considered as within the scope thereof as limited solely by the claims appended hereto.

In the following claims, those elements which do not include the words "means for" are intended not to be interpreted under 35 U.S.C. § 112 ¶ 6.

What is claimed is:

1. A method of determining the delay of a circuit, said method comprising the steps of:
   a. constructing a timing graph having nodes, each node belonging to a level;
   b. for each level of nodes, repeating the following steps:
      (1) grouping the nodes;
      (2) assigning a first group of nodes to a first processor for arrival time analysis; and
      (3) assigning a second group of nodes to a second processor for arrival time analysis.

2. A method according to claim 1 further comprising the step of assigning a third group of nodes to said first processor for arrival time analysis after said first processor completes the arrival time analysis of the nodes of said first group.

3. A method according to claim 1 wherein said first processor and said second processor operates simultaneously to analyze said first group and said second group, respectively.

4. A method according to claim 1 wherein said first group contains sixteen nodes.

5. A method according to claim 1 wherein each interval of the circuit is analyzed independently of other intervals.

6. A method according to claim 1 wherein said step b is applied beginning at level zero (0), input level, and ending at output level.

7. A method according to claim 1 wherein each level consists of nodes having a same depth in the timing graph.

8. A method according to claim 7 wherein depth of a node is a maximum number of edges in all possible paths from a circuit input node to the node.

9. An apparatus for determining the delay of a circuit, said apparatus comprising:
- a memory for storing computer-executable process steps; and
- a plurality of processors for executing said computer-executable process steps, wherein said computer-executable process steps comprise steps to:
- a. construct a timing graph having nodes, each node belonging to a level; and
- b. for each level of nodes, perform the following steps:
  (1) group the nodes;
  (2) assign a first group of nodes to a first processor for arrival time analysis; and
  (3) assign a second group of nodes to a second processor for arrival time analysis.

10. An apparatus according to claim 9 wherein each level consists of nodes having a same depth in the timing graph.

11. An apparatus according to claim 10 wherein depth of a node is a maximum number of edges in all possible paths from any circuit input node to the node.

* * * * *